(12) United States Patent
Heid et al.

(10) Patent No.: US 6,838,877 B2
(45) Date of Patent: Jan. 4, 2005

(54) METHOD FOR EVALUATING A TIME SIGNAL THAT CONTAINS SPECTROSCOPIC INFORMATION

(75) Inventors: Oliver Heid, Gunzenhausen (DE); Stefan Roell, Seigendorf (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/438,443

(22) Filed: May 15, 2003

(65) Prior Publication Data

US 2003/0214292 A1 Nov. 20, 2003

(30) Foreign Application Priority Data

May 17, 2002 (DE) ............................. 102 22 628

(51) Int. Cl.[7] .................................................. G01V 3/00
(52) U.S. Cl. ................................... 324/307; 324/309
(58) Field of Search ............................... 324/307, 309, 324/312, 314, 300

(56) References Cited

U.S. PATENT DOCUMENTS

| 5,841,891 A | * 11/1998 | Windig et al. | ............... 382/131 |
| 6,639,405 B2 | * 10/2003 | Liu et al. | ..................... 324/307 |
| 6,683,455 B2 | * 1/2004 | Ebbels et al. | ............... 324/309 |
| 6,686,739 B2 | * 2/2004 | Heid | .......................... 324/312 |

FOREIGN PATENT DOCUMENTS

DE OS 100 12 279 9/2001

OTHER PUBLICATIONS

"SVD–Based Quantification of Magnetic Resonance Signals," Pijnapeel et al., J. of Mag. Res., vol. 97 (1992), pp. 122–134.
"Optimization of Residual Water Signal Removal by HLSVD on Simulated Short Echo Time Proton MR Spectra of the Human Brain," Cabanes et al., J. of Mag. Res., vol. 150 (2001) pp. 116–125.
"Accurate Quantification of [1]H Spectra: From Finite Impulse Response Filter Design for Solvent Suppression in Parameter Estimation," Sundin et al., J. of Mag. Res., vol. 139 (1999), pp. 189–204.
"The Filtering Approach to Solvent Peak Suppression in MRS: A Critical Review," Coron et al., J. of Mag. Res., vol. 152 (2001), pp. 26–40.

* cited by examiner

*Primary Examiner*—Louis Arana
(74) *Attorney, Agent, or Firm*—Schiff Hardin LLP

(57) ABSTRACT

In a method for evaluating a time signal that is generated as a magnetic resonance signal by means of magnetic resonance technology and that contains spectroscopic information, an apodized time signal is formed by multiplying the time signal by a bell-shaped window function, an apodized spectrum is formed by Fourier transformation of the apodized time signal, an apodized informational spectrum is generated by removing noise components from the apodized spectrum, an apodized informational time signal is formed by Fourier back-transformation of the apodized informational spectrum, and an informational time signal is formed by multiplying the apodized informational time signal by an inverse function that corresponds in at least one section to the inverse window function.

15 Claims, 5 Drawing Sheets

METHOD FOR EVALUATING A TIME SIGNAL THAT CONTAINS SPECTROSCOPIC INFORMATION

BACKGROUND OF THE INVENTION

1. Field of the Invention

The present invention is directed to a method for evaluating a time signal that is generated as a magnetic resonance signal by means of magnetic resonance technology and that contains spectroscopic information.

2. Description of the Prior Art

Magnetic resonance spectroscopy has been utilized for more than four decades in basic physics, chemical and biochemical research, for example as an analysis technique or for structure clarification of complex molecules. Like magnetic resonance tomography, magnetic resonance spectroscopy is based on the principle of nuclear magnetic resonance. The primary objective of spectroscopy, however, is not imaging but the analysis of a substance. Resonant frequencies of isotopes that have a magnetic moment, for example $1_H$, $13_C$ or $31_P$, are dependent on the chemical structure of molecules wherein the isotopes are bonded. A determination of the resonant frequencies therefore allows differentiation between various substances. The signal intensity at the various resonant frequencies provides information about the concentration of the corresponding molecules.

When a molecule is introduced into a basic magnetic field of a magnetic resonance apparatus, as occurs in spectroscopy, electrons of the molecules shield the basic magnetic field from atomic nuclei of the molecule. As a result of this effect, the local magnetic field at the location of an atomic nucleus changes by a few millionths of the external basic magnetic field. The variation of the resonant frequency of this atomic nucleus associated therewith is referred to as the chemical shift. Molecules thus can be identified on the basis of their chemical shift. Since frequency differences can be acquired by measurement more simply and more precisely than absolute frequencies, the chemical shift is identified in ppm relative to a reference signal, for example the operating frequency of the magnetic resonance apparatus.

A resonance line of an atomic nucleus can be split into a number of lines when further atomic nuclei with a magnetic moment are situated in the environment of the atomic nucleus under observation. The cause of this is the spin-spin coupling between the atomic nuclei. The magnetic flux density of the basic magnetic field that an atomic nucleus experiences thus is not only dependent on the electron envelope around this atomic nucleus but also is dependent on the orientation of the magnetic fields of the neighboring atoms.

Clinical magnetic resonance spectroscopy is magnetic resonance spectroscopy using a clinical magnetic resonance apparatus. The methods of localized magnetic resonance spectroscopy basically differ from those of magnetic resonance imaging by the chemical shift also being resolved in spectroscopy in addition to the tomographic spatial resolution. Two localization methods of magnetic resonance spectroscopy currently dominate in the clinical application. A first of these, discrete (or individual or single) volume techniques based on echo methods wherein a spectrum of a previously selected target volume is recorded. As second of these are spectroscopic imaging methods, referred to as CSI methods (chemical shift imaging), which simultaneously enable the recording of spectra of many spatially interconnected target volumes.

Spectroscopic examination methods are employed in clinical phosphorous spectroscopy as well as in proton spectroscopy. For example, a three-dimensional CSI method includes the following steps: After a non-slice-selective 90° RF pulse, a combination of magnetic phase-encoding gradients of the three spatial directions is activated for a defined time, and the magnetic resonance signal is subsequently read out in the absence of any and all gradients. This is repeated with other combinations of phase-encoding gradients until the desired spatial resolution has been achieved. A four-dimensional Fourier transformation of the magnetic resonance signals supplies the desired spatial distribution of the resonance lines. A two-dimensional CSI method arises from the above-described three-dimensional method by the aforementioned, non-slice-selective RF pulse being replaced by a slice-selective excitation composed of a slice-selective RF pulse and a corresponding magnetic gradient, and the phase-encoding direction is eliminated.

The discrete volume techniques that are usually employed are based on the acquisition of a stimulated echo or of a secondary spin echo. In both instances, a spatial resolution ensues by means of successive selective excitations of three orthogonal slices. A target volume is defined by a section volume of the three slices. Only the magnetization of the target volume experiences all three selective RF pulses and thus contributes to the stimulated echo or secondary spin echo. The spectrum of the target volume is obtained by one-dimensional Fourier transformation of a time signal corresponding to the stimulated echo or to the secondary spin echo.

The intense water signals are often suppressed in clinical proton spectroscopy. For example, one method of such water suppression is the CHESS technique, wherein the nuclear spins of the water molecules are first selectively excited by narrow-band 90° RF pulses and their transverse magnetization is subsequently dephased by the activation of magnetic field gradients. A detectable magnetization of the water molecules is thus no longer available—in the ideal case—for a spectroscopy method that follows immediately thereafter.

For a prescribable volume to be examined, for example, a magnetic resonance signal is generated with one of the methods described above, this magnetic resonance signal being acquired in the time domain and being converted into an appertaining spectrum by a Fourier transformation, with, for example, a real part or (the magnitude) of the spectrum being presented. The spectrum is characterized by resonance lines that are referred to as spikes. These resonance lines or spikes usually occur in the form of narrow, bell-shaped curves. Each of the resonance lines or spikes can have a maximum amplitude value allocated to it that in turn defines an appertaining frequency value of the resonance line that is characteristic of the resonance line, and thus of a very specific magnetic resonance signal-emitting substance contained in the volume. Further, an integral value for one of the resonance lines or spikes in an absorption spectrum provides information about the concentration that the appertaining substance has in the volume under examination.

It is unavoidable in the practical application of spectroscopic methods that noise signals also are acquired as a consequence of the method and also contained in the magnetic resonance signal in addition to informational signals of interest. The amplitude of the noise signals can even exceed the informational signals by a multiple, which also degrades the interpretation of the informational signals when their characteristic frequencies clearly differ from characteristic frequencies of the noise signals because the resonance lines of the informational signals can experience an overlap in the region of a broad base region of an excessively powerful resonance line of a noise signal component. Further, a quantification of a base line is made more difficult as a result.

One group of methods for eliminating noise signals is based on a technique known as parameterization or a technique referred to as a fitting and subsequent subtraction of the noise signals. More recent methods of this type operate in the time domain. A common feature of these methods is the prescription of a model function of the noise signals is prescribed. Such methods are known, for example, from the article by W. W. F. Pijnappel et al., "SVD-Based Quantification of Magnetic resonance Signals", Journal of Magnetic resonance 97 (1992), pages 122–134, and from the article by E. Cabanes et al., "Optimization of residual Water Signal Removal by HLSVD on Simulated Short Echo Time Proton MR Spectra of the Human Brain", Journal of Magnetic Resonance 150 (2001), pages 116–125. These methods are based on the assumption that the noise signals can be presented as a sum of exponentially attenuated signals (Lorentz lines).

In an apparatus operating according to these methods, for example, a computational water suppression is implemented during the course of post-processing by a signal part derived from water being modeled as a noise signal by means of a polynomial function (spline function) in the time domain and being subsequently subtracted. These methods are not free of pre-conditions with respect to the line shape of the noise signals. Different noise signals meet these preconditions to different extents. The methods usually function well for narrow-band water signals but markedly less well for broadband fat signals.

Methods referred to as filter methods are known as a further group for eliminating noise signals. Such methods are disclosed, for example, in the article by T. Sundin et al., "Accurate Quantification of 1H Spectra: From Finite Impulse Response Filter Design for Solvent Suppression to Parameter Estimation", Journal of Magnetic Resonance 139 (1999), pages 189–204, and in the article by A. Coron et al., "The Filtering Approach to Solvent Peak Suppression in MRS: A Critical Review", Journal of Magnetic resonance 152 (2001), pages 26–40. In this group of methods, as well, it is assumed in the design of the filters that the informational signals and the noise signals are exponentially attenuated signals.

German OS 100 12 278 discloses a method for the operation of a magnetic resonance apparatus wherein a magnetic resonance signal is acquired for a time span, and whereby the magnetic resonance signal in the time domain is subjected to a Fourier transformation for generating a magnetic resonance spectrum. The magnetic resonance signal is weighted before the Fourier transformation with a bell-shaped window function that has a window width that is smaller than or equal to the time span and that is placed into a time range of the time span. In one embodiment, the bell-shaped window function is a symmetrical window function, for example a Hanning window function. Spectroscopy methods usually generate non-time-symmetrical time signals, i.e. asymmetrical time signals, which cause a spread of resonance lines in the spectrum. As a result of the method disclosed in German OS 100 12 278, the magnetic resonance signal is made symmetrical and a spread of the resonance lines is thereby prevented. The usefulness of spectra generated in this way, however, is limited because, among other things, the informational signals exhibit lower signal amplitudes compared to the non-symmetrical spectrum.

SUMMARY OF THE INVENTION

An object of the present invention is to provide a method for the evaluation of a time signal that is generated by means of magnetic resonance technique and contains spectroscopic information with which—among other things—a high suppression of noise signals can be achieved with an insignificant deterioration of informational signals.

This object is achieved in accordance with the invention in a method for evaluating a time signal that is generated as a magnetic resonance signal by means of magnetic resonance technology and that contains spectroscopic information wherein an apodized time signal is formed by multiplying the time signal by a bell-shaped window function, an apodized spectrum is formed by Fourier transformation of the apodized time signal, an apodized informational spectrum is generated by removing noise components from the apodized spectrum, an apodized informational time signal is formed by Fourier back-transformation of the apodized informational spectrum, and an informational time signal is formed by multiplying the apodized informational time signal by an inverse function that corresponds in at least one section to the inverse window function.

As a result, the advantages described in German OS 100 12 278 are used in order to be able to implement a clean separation of noise signals and informational signals, and, simultaneously, the disadvantages associated with the method disclosed in German OS 100 12 278—namely the modifications of amplitudes and areas of resonance lines—are reversed by means of the use of the inverse function. High suppression factors of noise signals given slight deterioration of the payload signals thus can be achieved. Further, the method is free of pre-conditions. The method also can be employed as a black-box method. The only required parameter setting is the selection of a mask for eliminating noise signals. The frequencies of noise signals are thereby often known, so that the mask can be defined in advance. Given N discrete measured values for describing the time signal, the numerical computational complexity of the method is determined by the complexity for the Fourier transformation. The method can be designed such that a fast Fourier transformation is used. The numerical outlay is then proportional to N·log(N) per Fourier transformation, or per Fourier back-transformation. The calculation ensues instantaneously on contemporary electronic computing units.

DESCRIPTION OF THE PREFERRED EMBODIMENTS

Figure 1:
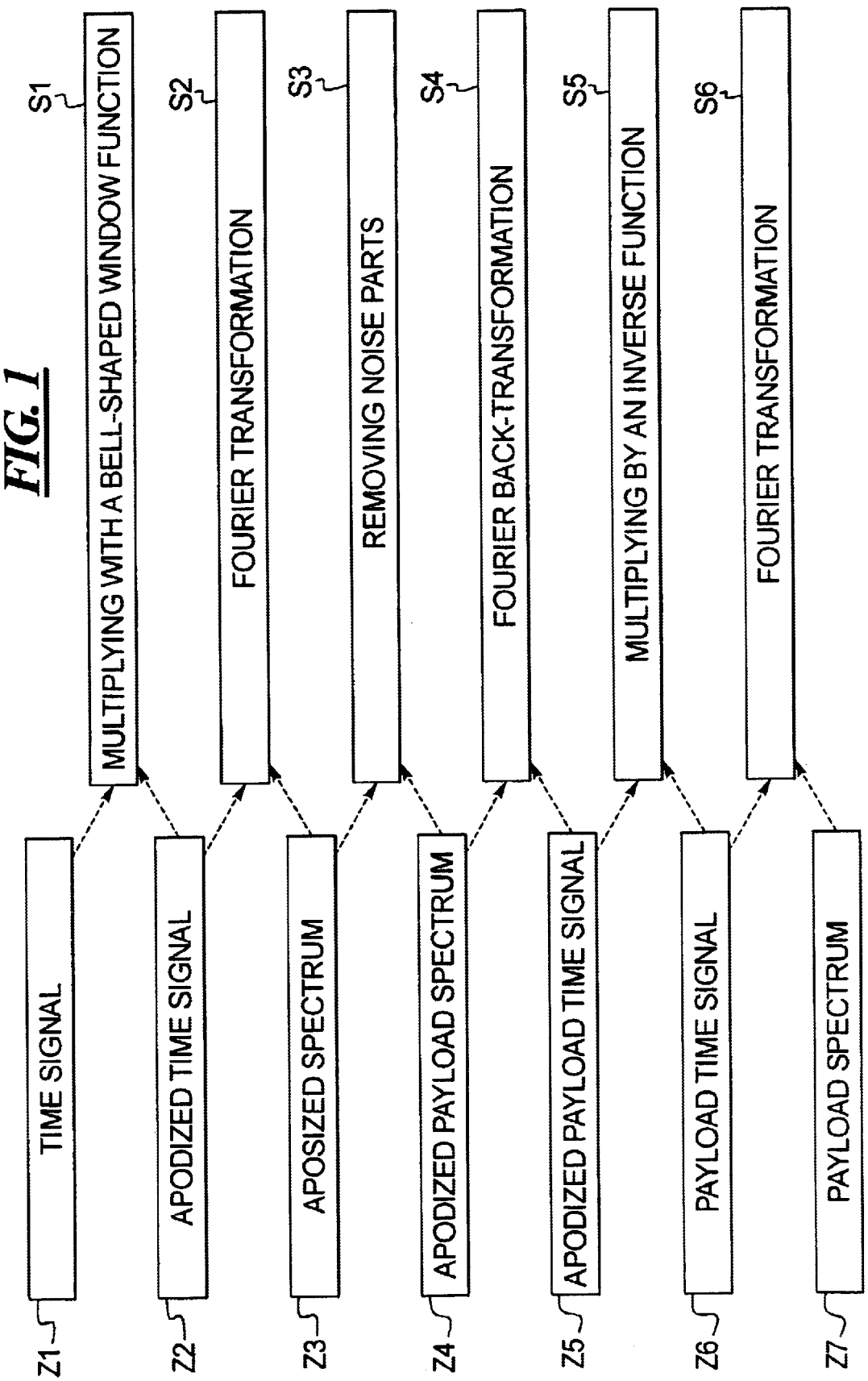
FIG. 1 is a flowchart of a method for evaluating a time signal that contains spectroscopic information in accordance with the invention.
Figure 2:
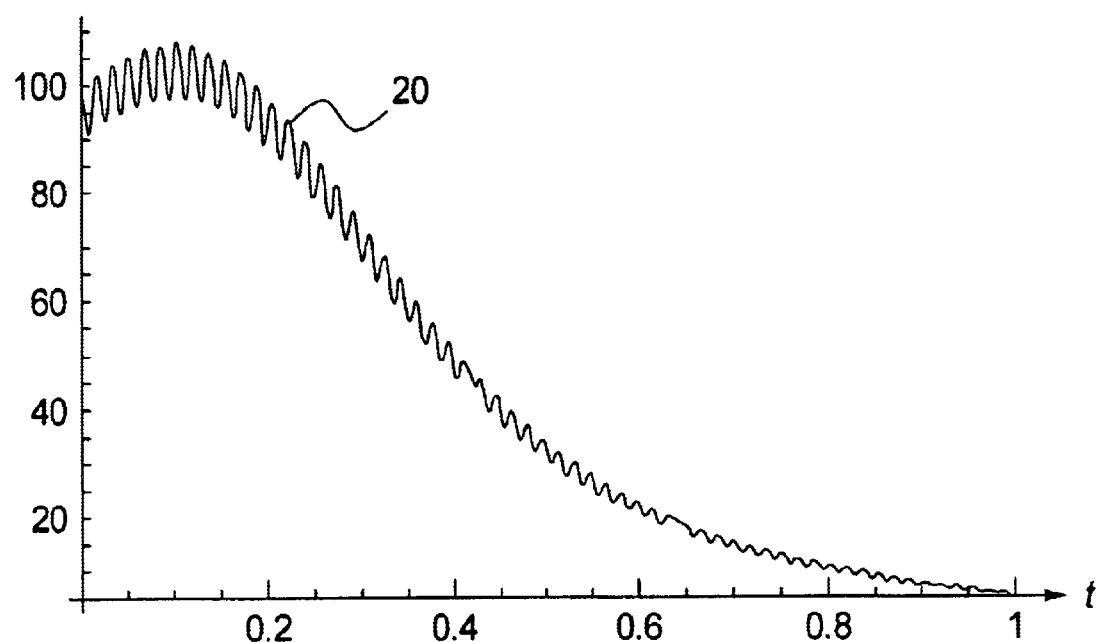
FIG. 2 shows the time signal used in the inventive method.

As an exemplary embodiment of the invention, FIG. 1 shows a flowchart of a method for the evaluation of a time signal that has been generated as a magnetic resonance signal by means of magnetic resonance technology that contains spectroscopic information. The respective processing state Z1 through Z7 of the time signal are indicated in the left region of the flowchart, and the individual processing steps S1 through S6 are indicated in the right region, In processing state Z1, a time signal 20 is present that contains an informational signal as well as a noise signal and that—as is standard in spectroscopy methods—has been acquired as a non-time-symmetrical signal, i.e. as an asymmetrical time signal. FIG. 2 shows the time signal 20. Conventionally spectroscopy methods are often designed such that an echo signal to be acquired as the time signal is already acquired in a time segment before an echo maximum. FIG. 2 shows that the time signal 20 has been acquired in a time range of about 0–0.15 of a normalized time t before the echo maximum that is localized, for instance, at time 0.15. It is advantageous in spectroscopy methods that are based on an echo signal to employ the echo maximum as the starting point of an evaluation of the time signal because the stating point defines the area encompassed by the spectrum and influences of the magnetic resonance apparatus, and thus possible splits of resonance lines are re-phased in the echo maximum, which enables a more precise evaluation of the spectrum.

Figure 10:
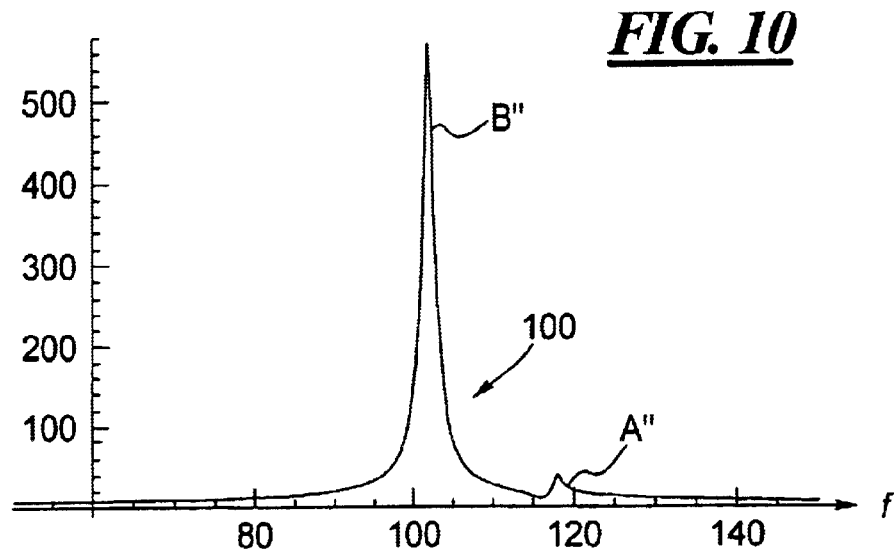
FIG. 10 shows a direct spectrum obtained as the Fourier transform of the time signal for purposes of comparison.

For comparison, FIG. 10 shows the direct spectrum 100 directly acquired from the time signal 20 by Fourier transformation. The direct spectrum 100 entered over the normalized frequency f exhibits two resonance lines A" and B". The resonance line B" will be assumed to arise from a substance, for example water, that occurs as a noise signal within the time signal 20. The resonance line A" will be assumed to arise from a substance of interest that occurs as an informational signal within the time signal 20. Due to the asymmetry of the time signal 20, the resonance line B" is particularly spread so significantly in its foot (base) region that it has an effect within the region of the resonance line A" of interest. In terms of a "pure" resonance line of the substance of interest to be attributed only to the informational signal, the resonance line A" is thus adulterated by the foot region of the resonance line B". It is also clear that a clean separation of noise and informational signals is not possible as a result, and a quantification of the informational signal is more difficult.

The aforementioned problems are avoided by the following method steps S1 through S3 and the appertaining processing states Z2 through Z4, in a basic framework corresponding to the method disclosed in German OS 100 12 278 described above.

Figure 3:
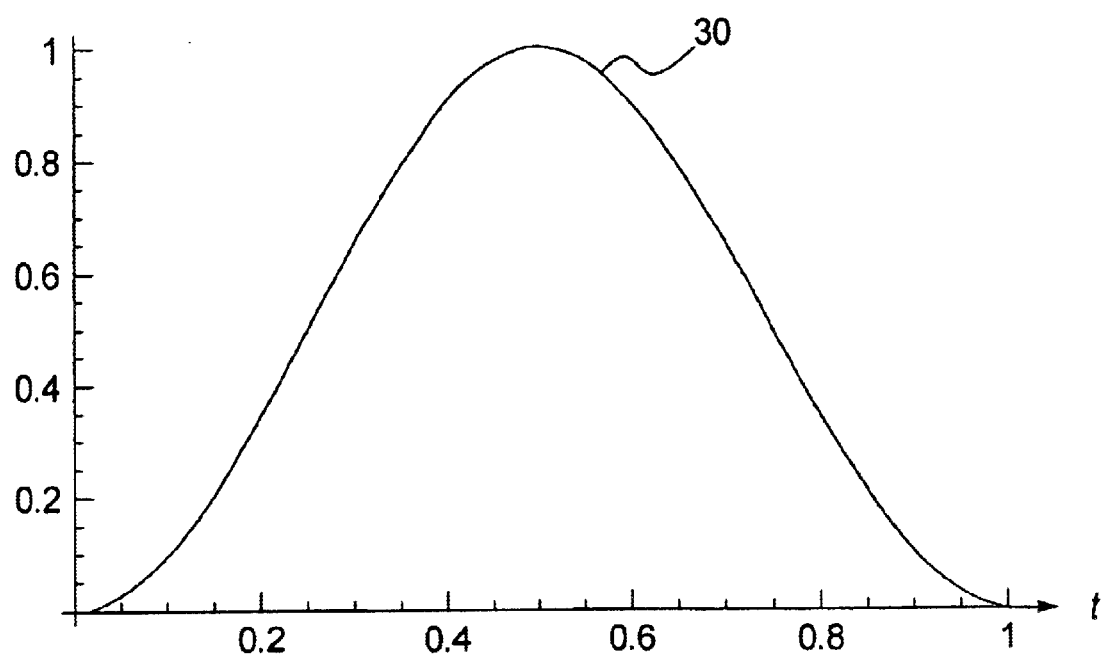
FIG. 3 shows a Hanning function used in the inventive method.

For forming an apodized time signal, the time signal 20 is multiplied by a time-symmetrical, bell-shaped window function in processing step S1, for example by the Hanning function 30 shown in FIG. 3. In other embodiments, other window functions cited, for example, in German OS 100 12 278 alternatively can be employed. In an embodiment, the window function is designed such that it asymptotically approaches zero at its boundaries.

Figure 4:
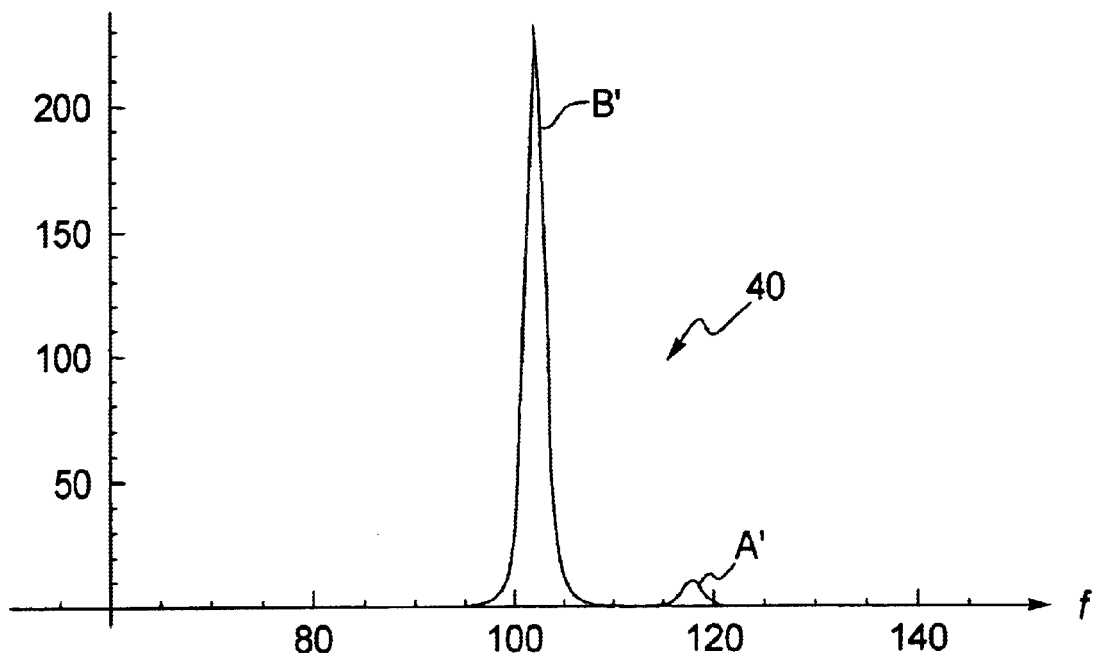
FIG. 4 is an apodized spectrum formed by a Fourier transform of the time signal multiplied by the Hanning function in accordance with the invention.

In processing step S2, an appertaining, apodized spectrum 40 is generated by Fourier transformation from the apodized time signal of the processing state Z2. This apodized spectrum 40 of the processing state Z3 is shown in FIG. 4. Compared to the direct spectrum 100 of FIG. 10, it can be seen—by applying the Hanning function 30—corresponding resonance lines A' and B' proceeding from their maximum values at their respective resonant frequencies approach zero at both sides with a function that is inversely proportional to the cube of the frequency f, which also keeps the resonance lines A' and B' narrow in their foot regions. In contrast, the resonance lines A" and B" of the direct spectrum 100 drop with a function that is only inversely proportional to the frequency f, resulting in resonance lines A" and B" with broad foot regions.

Figure 5:
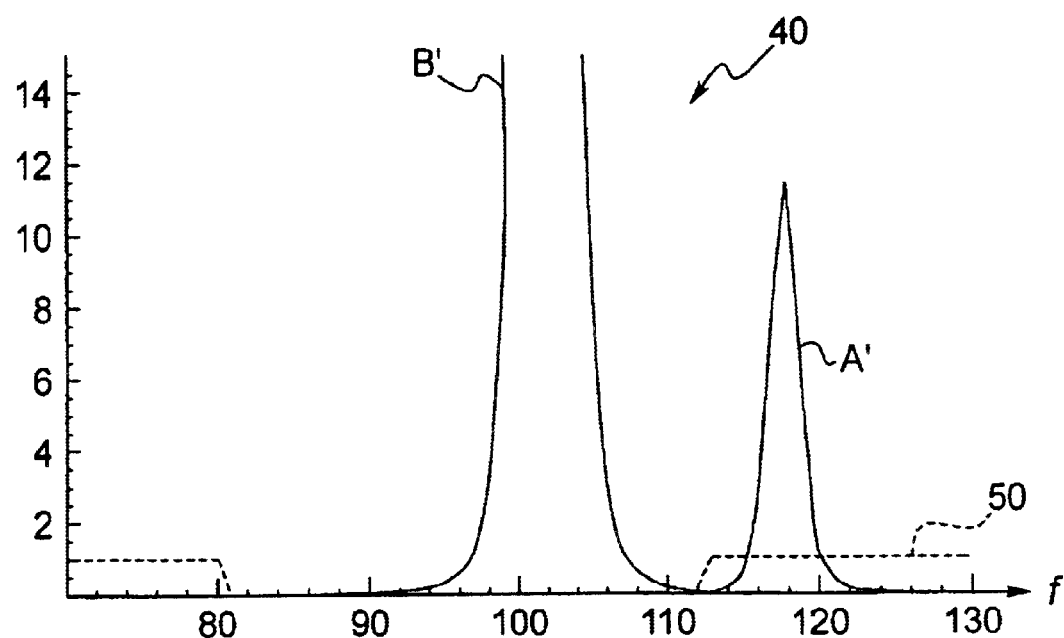
FIG. 5 is the apodized spectrum with a mask function before removal of noise components in the inventive method.
Figure 6:
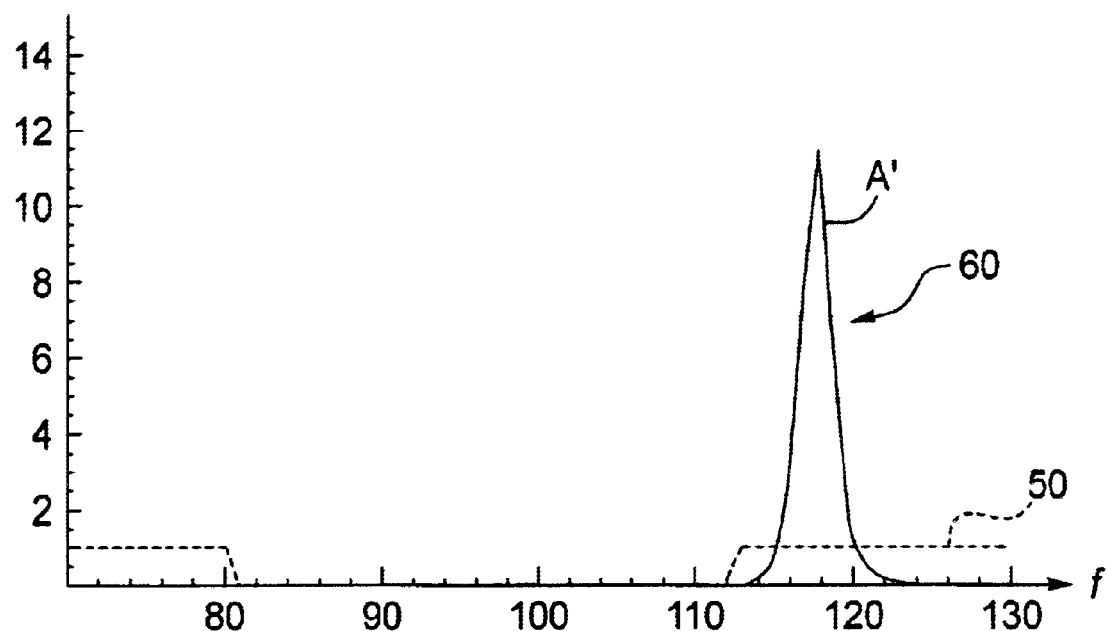
FIG. 6 is an apodized informational spectrum with the mask function after removal of noise components in the inventive method.

As a result of the narrow foot width of each of the resonance lines A' and B', an unambiguous separation of the two resonance lines A' and B' is possible, so that the noise signal can be eliminated in a processing step S3 by multiplying the apodized spectrum 40 by a mask function 50. To that end, FIG. 5 shows the apodized spectrum 40 with the amplitude enlarged and a dot-dashed line therein showing the mask function 50 with which the noise signal in the form of the resonance line B' can be eliminated. The result of the elimination leads to an apodized payload spectrum 60 that is shown in FIG. 6 together with the mask function 50 (indicated dot-dash).

The diagnostic relevance of this apodized informational spectrum 60 of the processing state Z4, however, is reduced because that amplitudes of the resonance lines A' and B' are decreased with respect to the time signal 20 as a result of the multiplication by the window function, and the area under resonance lines A' and B' therefore also has been modified as a criterion for a concentration of the substances in the measurement volume that belong to the resonance lines A' and B'. These unwanted effects are reversed by the processing steps S4 through S6 of the invention. To that end, the apodized informational spectrum 60 is first converted into a symmetrical, apodized informational time signal of processing state Z5 by means of Fourier back-transformation in processing step S4.

Figure 7:
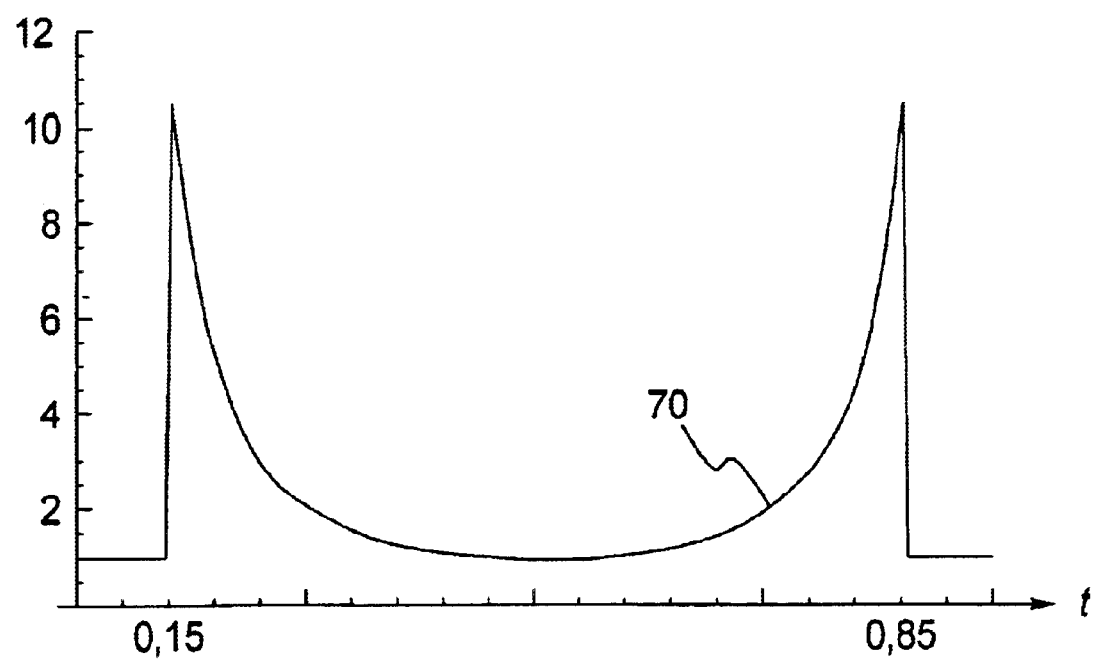
FIG. 7 is an inverse function that corresponds, at least in a middle section, to the inverse window function.
Figure 8:
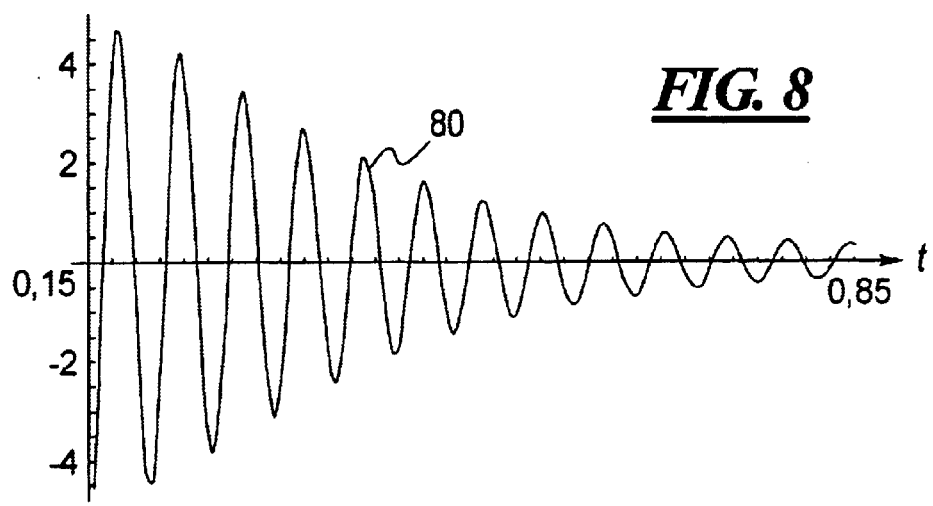
FIG. 8 is an informational time signal formed by a Fourier back-transform of the apodized informational spectrum multiplied by the inverse function in the inventive method.
Figure 9:
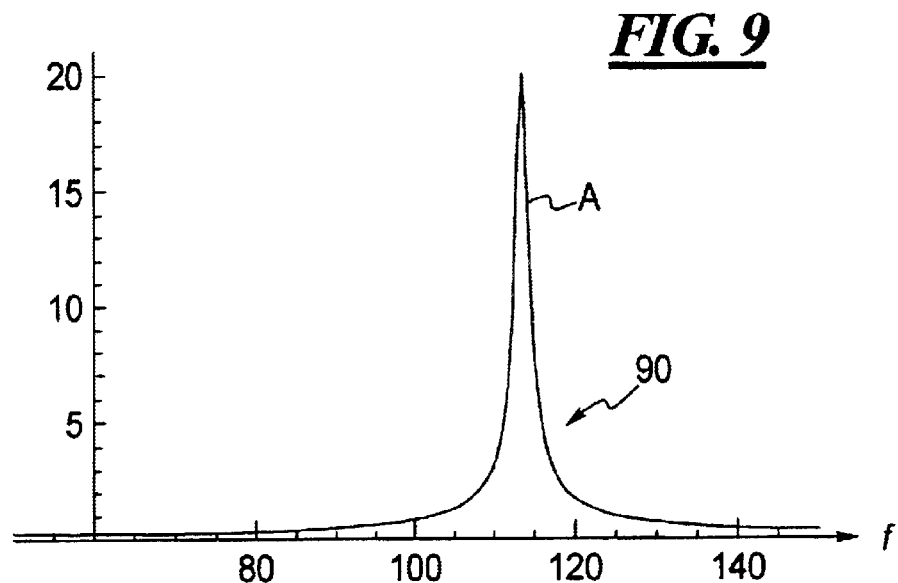
FIG. 9 is an informational spectrum formed by a Fourier transform of the informational time signal in the inventive method.

For forming an informational time signal 80, the apodized informational time signal is multiplied in processing step S5 by an inverse function 70 that corresponds to the inverse Hanning function 30 of FIG. 3 in a significant, middle section. FIG. 7 shows the inverse function 70 that corresponds to the inverse Hanning function in the segment of approximately 0.15–0.85 of the normalized time t, and that exhibits the constant value of one in its edge regions. The cancellation of the unwanted effects is successfully implemented over broad parts of the time signal 20 with marginal and governable loss of numerical precision. A loss of less than one place following the decimal point can be achieved over approximately 80% of the time signal 20 with the Hanning function 30 employed as an example. In particular, a reconstruction of the time signal 20 at the echo maximum succeeds in the illustrated exemplary embodiment. As already mentioned, this is especially advantageous since influences of the magnetic resonance apparatus are re-phased in the echo maximum, and the first point of the time signal defines the area encompassed by the spectrum, so that employment of the echo maximum as a first evaluation point enables a more precise quantitative evaluation of the spectrum. Of course, other embodiments of the method are useful when no echo maximum is generated, since signal losses can be inherently kept low at the beginning of the time signal. Signal losses at the end of the inherently decaying time signal are not critical anyway, In processing step S6 the informational time signal 80 of the processing state Z6 is converted by Fourier transformation into an informational spectrum 90 without signal losses, with the informational spectrum 90 of the processing state Z7 being shown in FIG. 9. With reference to the original time signal 20, the resonance line A of the informational spectrum 90 is unfalsified in terms of its amplitude as well as in terms of the area it encloses.

In other embodiments, the informational time signal formed in this way can be employed as a basis for known methods for automatic evaluation.

The disclosed method, for example, can be advantageously employed in prostate examinations of male patients. Fat signals are advantageously eliminated from spectra of the prostate. Informational signals of the prostate mainly arise from the substances citrate (Ci), creatine (Cr) and choline (Cho). A high ratio of the concentrations [Ci]/([Cr]+[Cho]) characterizes healthy prostate tissue, and significantly reduced concentration ratios have been found in prostate carcinoma. Lipid signals from fatty tissue that surrounds the prostate deteriorate the quantification of the informational signals. Lipid signals are multiplet signals whose parameterization with the initially described model functions is difficult. The employment of the inventive method is so efficient that lipid signals—whose intensity exceeds that of the payload signals by a thousand times—can be eliminated even without additional, experimental lipid suppression methods.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for evaluating a magnetic resonance time signal containing spectroscopic information, comprising the steps of:

multiplying said time signal by a bell-shaped window function to obtain an apodized time signal;

Fourier transforming said apodized time signal to obtain an apodized spectrum;

removing noise components from said apodized spectrum to obtain an apodized informational spectrum;

Fourier back-transforming said apodized informational spectrum to obtain an apodized informational time signal; and multiplying said apodized informational time signal by an inverse function corresponding, in at least one section thereof, to the inverse of said window function to obtain an informational time signal.

2. A method as claimed in claim 1 comprising the additional step of Fourier transforming said informational time signal to obtain an informational spectrum.

3. A method as claimed in claim 1 comprising selecting said window function so that respective periodic continuations of said apodized time signal at opposite ends of said apodized time signal merge substantially steadily into each other.

4. A method as claimed in claim 1 comprising employing a symmetrical window function as said window function.

5. A method as claimed in claim 1 comprising employing a window function having a window width corresponding to a time span of said time signal, as said window function.

6. A method as claimed in claim 1 comprising employing a Hanning function as said window function.

7. A method as claimed in claim 1 comprising employing an inverse function corresponding in a middle section thereof to the inverse of said window function.

8. A method as claimed in claim 1 comprising employing an inverse function equal to a constant value outside of said at least one section.

9. A method as claimed in claim 8 comprising employing an inverse function equal to one outside of said at least one section.

10. A method as claimed in claim 1 comprising generating said time signal as an echo signal with an echo maximum.

11. A method as claimed in claim 10 wherein said time signal includes a portion of said echo signal preceding said echo maximum.

12. A method as claimed in claim 11 comprising employing an inverse function wherein said at least one section encompasses a point in time of said echo maximum.

13. A method as claimed in claim 1 wherein the step of removing said noise components comprises removing said noise components from said apodized spectrum by multiplying said apodized spectrum by a mask function.

14. A method as claimed in claim 13 comprising forming said mask function by sub-sections selected from the group consisting of trapezoidal sub-sections and rectangular sub-sections.

15. A method as claimed in claim 13 comprising employing a mask function varying between zero and one, as said mask function.

* * * * *